United States Patent [19]

Matsumura et al.

[11] Patent Number: 5,151,871
[45] Date of Patent: Sep. 29, 1992

[54] METHOD FOR HEAT-PROCESSING SEMICONDUCTOR DEVICE AND APPARATUS FOR THE SAME

[75] Inventors: Kimiharu Matsumura, Kumamoto; Hiroyuki Sakai, Nishigoshi; Masaaki Murakami, Kumamoto; Tetsuya Oda, Tamana; Chizo Yamaguchi, Sencho, all of Japan

[73] Assignees: Tokyo Electron Limited, Tokyo; Tokyo Electron Kyushu Limited, Kumamoto, both of Japan

[21] Appl. No.: 538,710

[22] Filed: Jun. 15, 1990

[30] Foreign Application Priority Data

Jun. 16, 1989 [JP] Japan .................. 1-154119
Oct. 24, 1989 [JP] Japan .................. 1-276564

[51] Int. Cl.$^5$ .............................................. H05B 3/68
[52] U.S. Cl. ................................. 364/557; 219/457; 219/464
[58] Field of Search .............. 364/557, 505, 477; 219/405, 411, 388, 390, 457, 464, 465

[56] References Cited

U.S. PATENT DOCUMENTS

| | | | |
|---|---|---|---|
| 4,481,406 | 11/1984 | Muka | 219/405 X |
| 4,504,730 | 3/1985 | Shimizu | 219/405 X |
| 4,688,180 | 8/1987 | Motomiya | 364/557 X |
| 4,690,569 | 9/1987 | Veitch | 364/557 X |
| 4,794,217 | 12/1988 | Quan et al. | 219/10.67 X |
| 4,881,591 | 11/1989 | Rignall | 364/557 X |
| 4,958,061 | 9/1990 | Wakabayashi et al. | 219/411 |
| 4,982,347 | 1/1991 | Rackerby et al. | 364/557 |
| 5,001,327 | 3/1991 | Hirasawa et al. | 219/390 |

FOREIGN PATENT DOCUMENTS

| | | |
|---|---|---|
| 58-21332 | 2/1983 | Japan . |
| 61-12030 | 1/1986 | Japan . |
| 61-23321 | 1/1986 | Japan . |
| 61-67224 | 4/1986 | Japan . |
| 61-201426 | 9/1986 | Japan . |
| 61-235835 | 10/1986 | Japan . |
| 61-271834 | 12/1986 | Japan . |

Primary Examiner—Joseph L. Dixon
Attorney, Agent, or Firm—Oblon, Spivak, McClelland, Maier & Neustadt

[57] ABSTRACT

CPU stores information showing a time-temperature relationship and applicable for either heating a semiconductor wafer to a hold temperature for a predetermined period of time or cooling the wafer from the hold temperature over a predetermined period of time, or for both, read the information. A conductive thin film heats the wafer in accordance with the information. A sensor detects the temperature of the wafer. A control system controls either the heating of the wafer or the cooling thereof, or both, in accordance with the detected temperature signal and the information.

12 Claims, 8 Drawing Sheets

PRIOR ART

F I G. 1

F I G. 4

PRIOR ART

F I G. 2

PRIOR ART

METHOD FOR HEAT-PROCESSING SEMICONDUCTOR DEVICE AND APPARATUS FOR THE SAME

BACKGROUND OF THE INVENTION

1. Field of the Invention

The present invention relates to method and apparatus for heat-processing semiconductor wafer or LCD and, more particularly, it relates to method and apparatus capable of controlling temperatures of these semiconductor wafers or LCD when these are heated up and cooled down.

2. Description of the Related Art

Various kinds of heating processes are included in the course of manufacturing various kinds of devices in which semiconductors are included. Semiconductor wafers are heated at the adhesion and baking processes in the course of photo-lithographing semiconductor integrated circuits, for example. More specifically, the semiconductor wafers are heated and their surfaces are treated with HMDS vapor at the adhesion process so as to promote the photoresist bonding performance on wafer surface. After the semiconductor wafer being coated with photoresist, which is baked at a certain temperature to remove solvent in the photoresist and to enhance the polymetric cross linking of photoresist.

Figure 1:
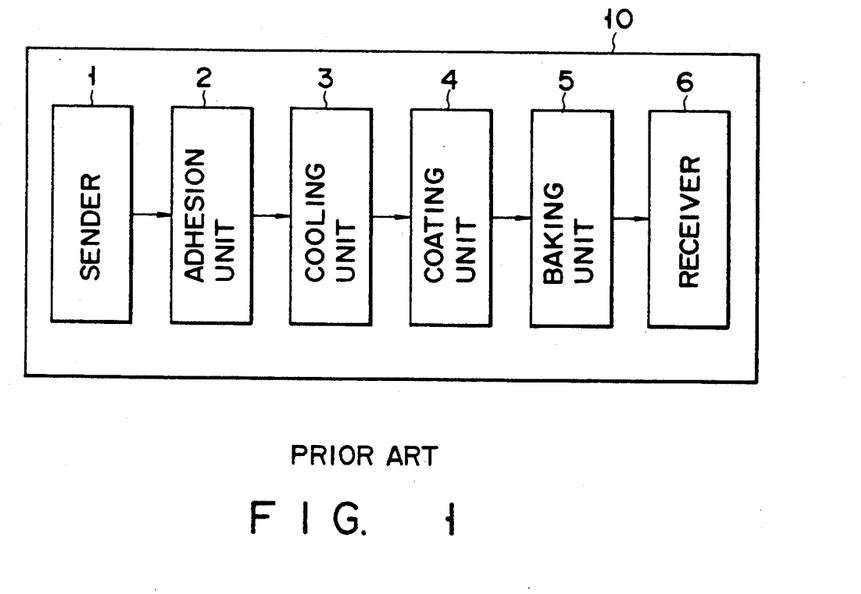
FIG. 1 is a block diagram showing a layout of the resist processing system in which a conventional heat-processing method is employed.

As shown in FIG. 1, various kinds of processing units 1 to 6 are housed in a resist-processing system 10 to process the semiconductor wafers one by one. A sender 1 is located on the inlet side of the system 10 and a receiver 6 on the outlet side thereof. The semiconductor wafer is transferred one by one from the sender 1 to an adhesion unit 2, and adhesion-processed by the adhesion unit 2. After being heated by the adhesion unit 2, the semiconductor wafers are forcedly cooled by a cooling unit 3 and coated with photoresist in a coating unit 4. After being coated with photoresist, they are baked by a baking unit 5 and transfer to the receiver 6. They are carried from the receiver 6 to an exposure unit (not shown) through an interface (not shown) and exposed by the exposure unit located outside the system 10.

It is needed that the semiconductor wafers are forcedly cooled at a high speed by the cooling unit 3. This is because temperatures of the wafers must be accurately controlled and their surfaces must be cooled to have a certain temperature so as to uniformly coat their surfaces with resist at a next process.

In other words, the temperature of the wafer which has been processed by the conventional adhesion unit 2 depends upon its temperature obtained when the adhesion process is finished relative to it on a wafer-stage in the unit 2. This causes its temperature to variously changes and not to be kept certain. After it is adhesion-processed by the conventional unit 2, therefore, it must be cooling-processed by the unit 3. The whole of the conventional resist-processing system thus becomes large in size. In addition, a forcedly-cooling time is added to the wafer-carrying time in the cooling unit 3 in the case of the conventional system, thereby reducing the throughput of the wafers. Further, when the time during which the wafer is processed through the whole of the system is long, it causes more particles of dust and the like to adhere to the semiconductor wafer. This is not preferable from the viewpoint of quality control.

In the case of the conventional baking unit 5, the semiconductor wafer is mounted on a heating plate made of stainless steel or aluminum alloy and heated by the heating plate. A thick heating element is embedded in this conventional heating plate, the plate has a great thickness of 30 to 50 mm and its heat capacity is large accordingly. This causes the conventional heating plate not to quickly raise and lower the temperature of the wafer-stage in the baking unit 5. Particularly, quick cooling is theoretically difficult because the heating plate has a limitation in its cooling speed.

Figure 2:
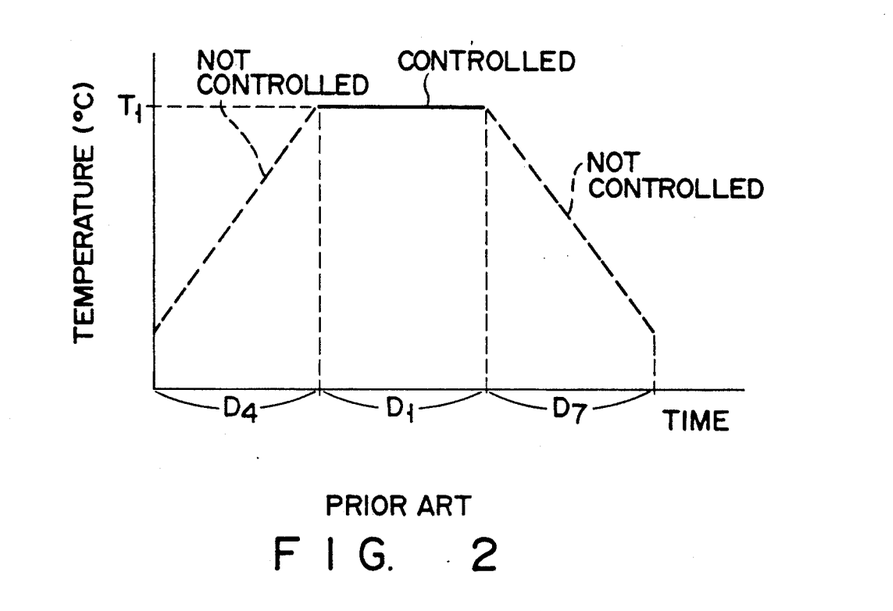
FIGS. 2 and 3 are graphs showing heat curves of a wafer-stage which is heated and cooled according to a conventional method.

As apparent from the thermal history curve shown in FIG. 2, the temperature of the wafer-stage can be controlled only when it is kept at a baking temperature $T_1$ but it cannot be controlled while it is being raised and cooled. The thermal history curve covering the whole of baking temperatures cannot be therefore guaranteed as desired. In addition, the heat capacity of the heating plate is large in this case. The heating and cooling response of the heating plate is thus made slow and those times $D_4$ and $D_7$ which are needed to raise and lower the temperature of the wafer-stage become long, respectively.

Figure 3:
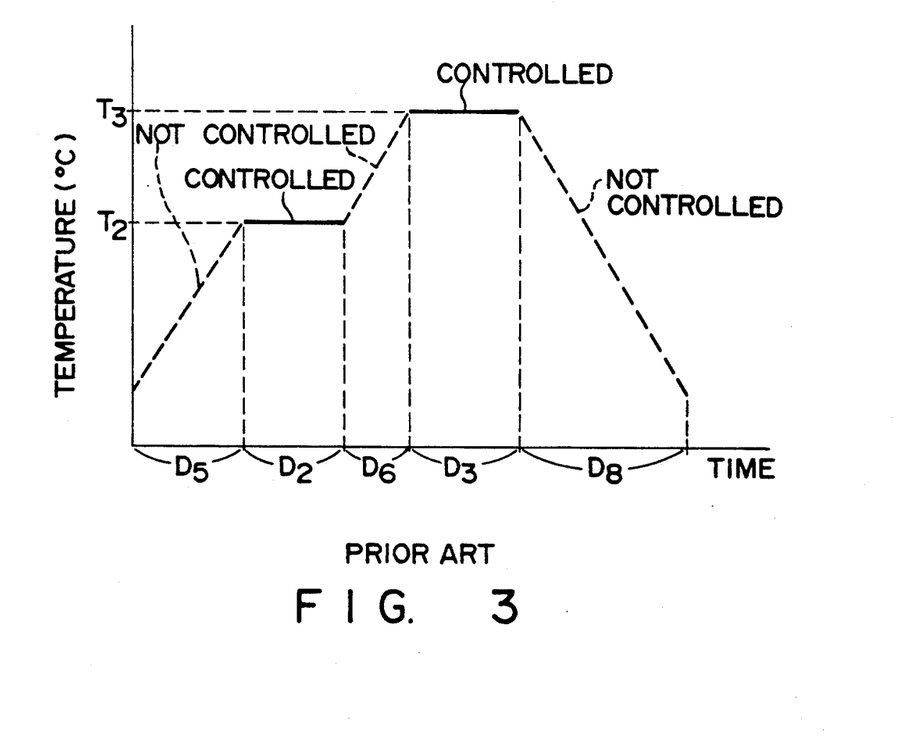

As the thermal history curve in FIG. 3 indicates, the baking unit heats the semiconductor wafer stepwise in some cases, thereby to enhance the thermal durability of the resist film formed on the wafer by cross linking polymerization. The baking unit is controlled such that the temperature of the wafer-stage remains at baking temperature $T_2$ for a predetermined time and then at baking temperature $T_3$ for a predetermined time. However, neither the time $D_5$ for heating the stage from an initial value to temperature $T_2$ nor the time $D_6$ for heating it from temperature $T_2$ to temperature $T_3$ is controlled at all. These periods $D_5$ and $D_6$ are relatively long, and the sum of them is thus considerably long, inevitably lengthening the total baking time very much. Consequently, the throughput of the wafers is reduced. To prevent reduction of throughput, it is necessary to use a number of heating plates.

As the density of semiconductor devices is made higher and higher, resist patterns of these devices have become finer and finer. The thermal history curve (or temperature changing pattern) of the wafer-stage at the stage-heating and -cooling times which was neglected in the case of the conventional system comes to add large influence to the resolution and light-sensitivity of the photoresist. This makes it seriously necessary to develop a system capable of controlling the temperature of the wafer-stage to obtain a thermal history curve as desired at the stage-heating and -cooling times.

Particularly in the case of the conventional system, the temperature of the wafer-stage was not a controlled predetermined condition at the stage-heating and -cooling times. Even when the semiconductor wafers of the same kinds were baking-processed, therefore, the property of one wafer became different from those of the other ones, thereby damaging the reliability of the semiconductor wafers thus produced.

SUMMARY OF THE INVENTION

The object of the present invention is therefore to provide a simpler method of heat-processing semiconductor devices whereby temperatures of the semiconductor devices can be controlled at devices-heating and -cooling times so as to accurately control their thermal history curve.

According to an aspect of the present invention, there can be provided a method for heat-processing object comprising the steps of:

storing, as a predetermined recipe, information showing a time-temperature relationship and applicable for either heating the object to a predetermined temperature for a predetermined period of time or cooling the object from a predetermined temperature over a predetermined period of time, or for both;

reading the information and applying the information;

heating the object by means of a conductive thin film in accordance with the information;

detecting the temperature of the object directly or indirectly; and controlling either the heating of the object or the cooling thereof, or both, in accordance with the detected temperature and the information.

According to another aspect of the present invention, there can be provided an apparatus for heat-processing object comprising, a stage having a conductive thin film for heating the object; a detecting means for detecting temperatures of the object; a storing means for previously storing as a predetermined recipe, information showing a time-temperature relationship and applicable for either heating the object to a predetermined temperature for a predetermined period of time or cooling the object from a predetermined temperature over a predetermined period of time, or for both, and a control means for reading the information in the storing means, and for receiving signal relating to the temperatures of the object detected by the detecting means, and for controlling a period of heat up and cool down responsive to the information and signal while heating the object by said conductive thin film.

It is preferable that the apparatus further includes a means for forcedly cooling the object.

It is also preferable that any of those heating plates which are formed according to the heating theory of the conductive thin film is used as the heating element. This is because these heating plates are smaller in heat capacity and more excellent in response.

It is also preferable that any of those heat-generating resistance materials which are more excellent in response and thermal durability is used as the conductive thin film. These heat-generating resistance materials include metal, alloy, carbon material, polymer composite and composite ceramic (which is conductive).

The single metal of which the conductive thin film is chromium, nickel, platinum, tantalum, tungsten, tin, iron, lead, beryllium, antimony, indium, cobalt, strontium, rhodium, palladium, magnesium, molybdenum, lithium or rubidium. Nichrome, stainless steel, bronze, brass, alumel and chromel are mentioned as the alloy of which the conductive thin film is made. Carbon black, graphite and the like are mentioned as the carbon material of which the conductive thin film is made. The polymer composite for the conductive thin film includes polymer graft carbon and the like. Moybdenum silicide is used as the composite ceramic of which the conductive thin film is made. The composite ceramic includes cermet also.

It is preferable that the conductive thin film is made of any of those materials whose electric resistances become smaller as temperature becomes higher or lower. This is because a large amount of current can concentrate on those areas in the conductive thin film where temperature is relatively lower so as to increase the speed of raising the temperature of these areas in the conductive thin film and to enable the film to have a uniform temperature in the whole of it when the film is heated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Some embodiments of the present invention will be described in detail with reference to the accompanying drawings.

Figure 4:
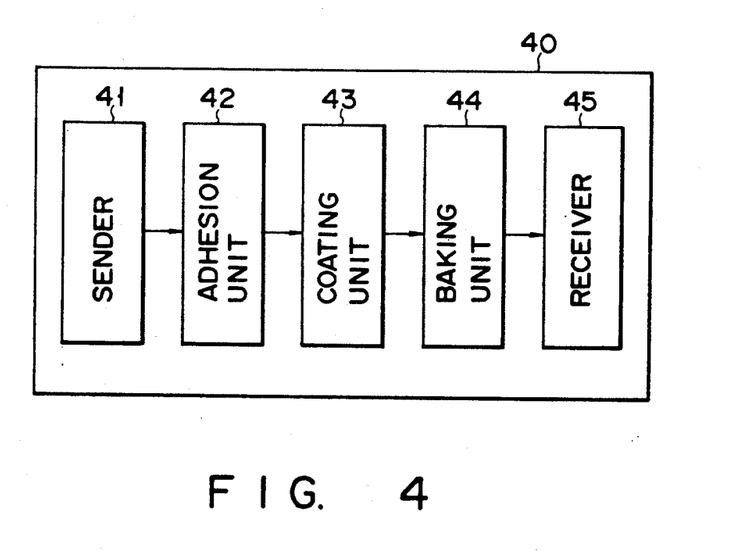
FIG. 4 is a block diagram showing a layout of a resist processing system in which a heat-processing method is employed according to a present invention.

As shown in FIG. 4, various kinds of processing units 41 to 45 are housed in a resist processing system 40 and semiconductor wafers W are continuously processed by these processing units. A sender 41 is located on the inlet side of the system 40 while a receiver 45 on the outlet side of the system 40. A cassette carrying robot (not shown) can run on a clean track which extends to a cassette stage located adjacent to the sender 41. The sender 41 serves to pick up the semiconductor wafers W one by one and transfer them to the adhesion unit 42 where they are heated and coated with HMDS.

The coating unit 43 is located next to the adhesion unit 42 and it serves to form resist film of a certain thickness on the surface of each of the semiconductor wafers W. The baking unit 44 is located next to the coating unit 43, serving to bake each of the semiconductor wafers W at a certain temperature.

The receiver 45 is located next to the baking unit 44 and it serves to receive the semiconductor wafers W which have been resist-processed.

An exposure unit (not shown) is located exterior of the resist processing system 40. An interface (not shown) is arranged between the receiver 45 and the exposure unit and the semiconductor wafers W are transferred to the exposure unit by the interface.

Figure 5A:
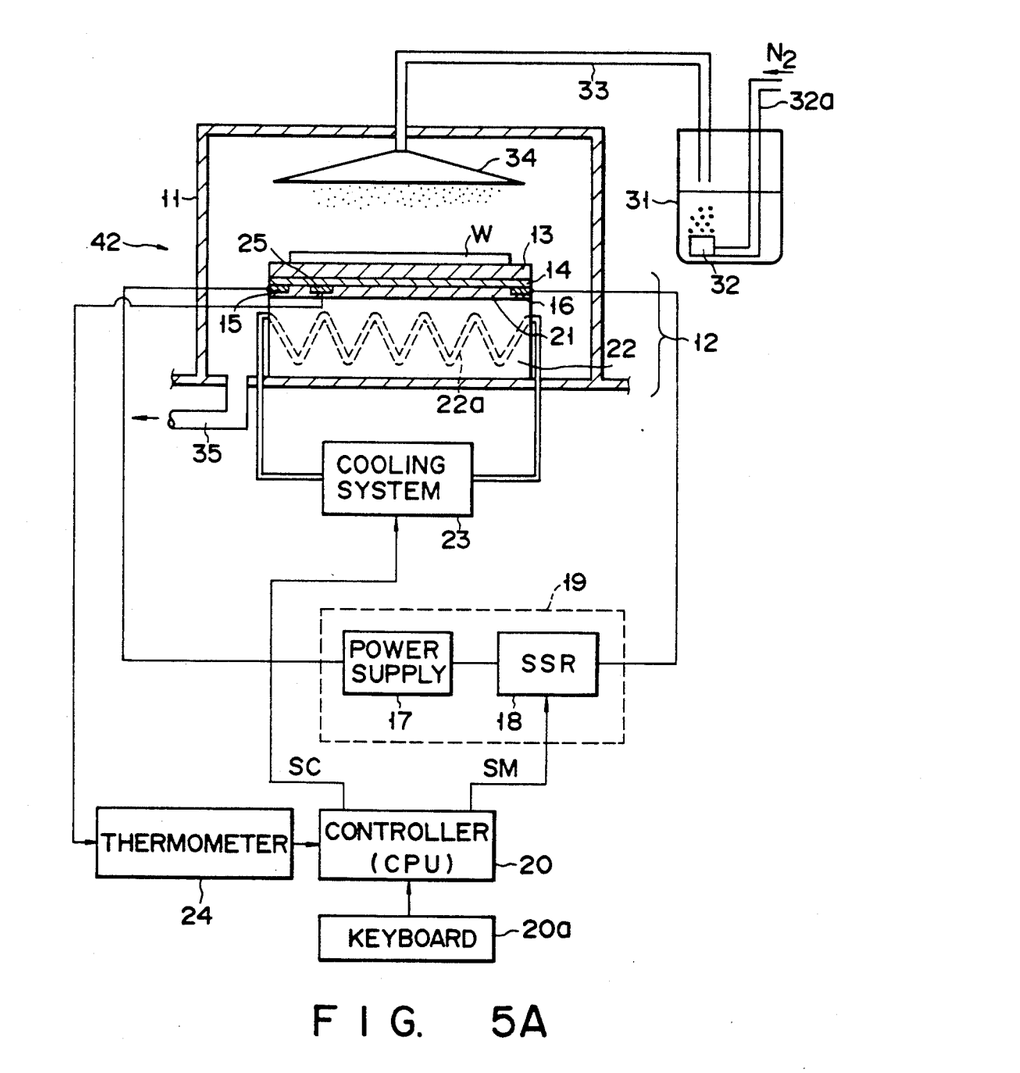
FIG. 5A is a diagram showing a circuit of an adhesion unit which is included in a resist processing system.

The adhesion unit 42 will be described referring to FIG. 5A. A case where the adhesion unit 42 includes a wafer-stage 12 which can serve to heat and cool the semiconductor wafers W will be described and this wafer-stage 12 may also be used in the baking unit 44.

The stage 12 on which the semiconductor wafer W is to be mounted is arranged in a chamber of the adhesion unit 42. An HMDS supply tube 33 extends passing through the top of the chamber 11. A diffusion plate 34 is attached to the front end of the supply tube 33, opposing to the wafer W on the table 12. The underportion of the diffusion plate 34 is provided with a plurality of apertures which are communicated with the inside of a bottle 31 through the supply tube 33. A bubbler 32 is immersed in HMDS solution in the bottle 31 and connected to a nitrogen gassupply source (not shown) through a pipe 32a.

A discharge pipe 35 extends from the bottom of the chamber 11 to a vacuum pump (not shown).

The semiconductor wafer W which has a size of 8 inches is mounted on the stage 12. The diffusion plate 34 is shaped to cover the whole area of the stage 12. An upper plate 13 of the stage 12 is made of alumina. It may be instead made of ceramics if they have characters of insulation and thermal conductivity. The upper plate 13 has longitudinal side and transversal side each of which is in a range of 160 to 180 mm, and its thickness is in a range of 1 to 20 mm, more preferably in a range of 5 to 10 mm.

Conductive thin film 14 is formed on the whole areas of the underside of the upper plate 13 by depositing metal chromium alone on the underside of the upper plate 13. The thickness of this conductive thin film 14 is in a range of 0.1 to 100 μm, more preferably in a range of 0.5 to 2 μm.

Pins (not shown) are attached to the stage 12 to pick up the semiconductor wafer W from the upper plate 13. The semiconductor wafer W is unloaded from the stage 12 by the pins.

Electrodes 15 and 16 each made of copper and shaped like a stripe are attached to the underside of peripheral portion of the conductive thin film 14. These electrodes 15 and 16 are connected to a power supply circuit 19. The power supply circuit 19 includes a commercial AC power supply 17 and an SSR (solid state relay) 18. The SSR 18 serves as a switching element. A control system 20 includes a CPU 201 and a PID controller 203. The control system 20 serves to apply signals SM and SC to the SSR 18 and a cooling system 23 responsive to inputted recipes and temperature detecting signal.

Figure 5B:
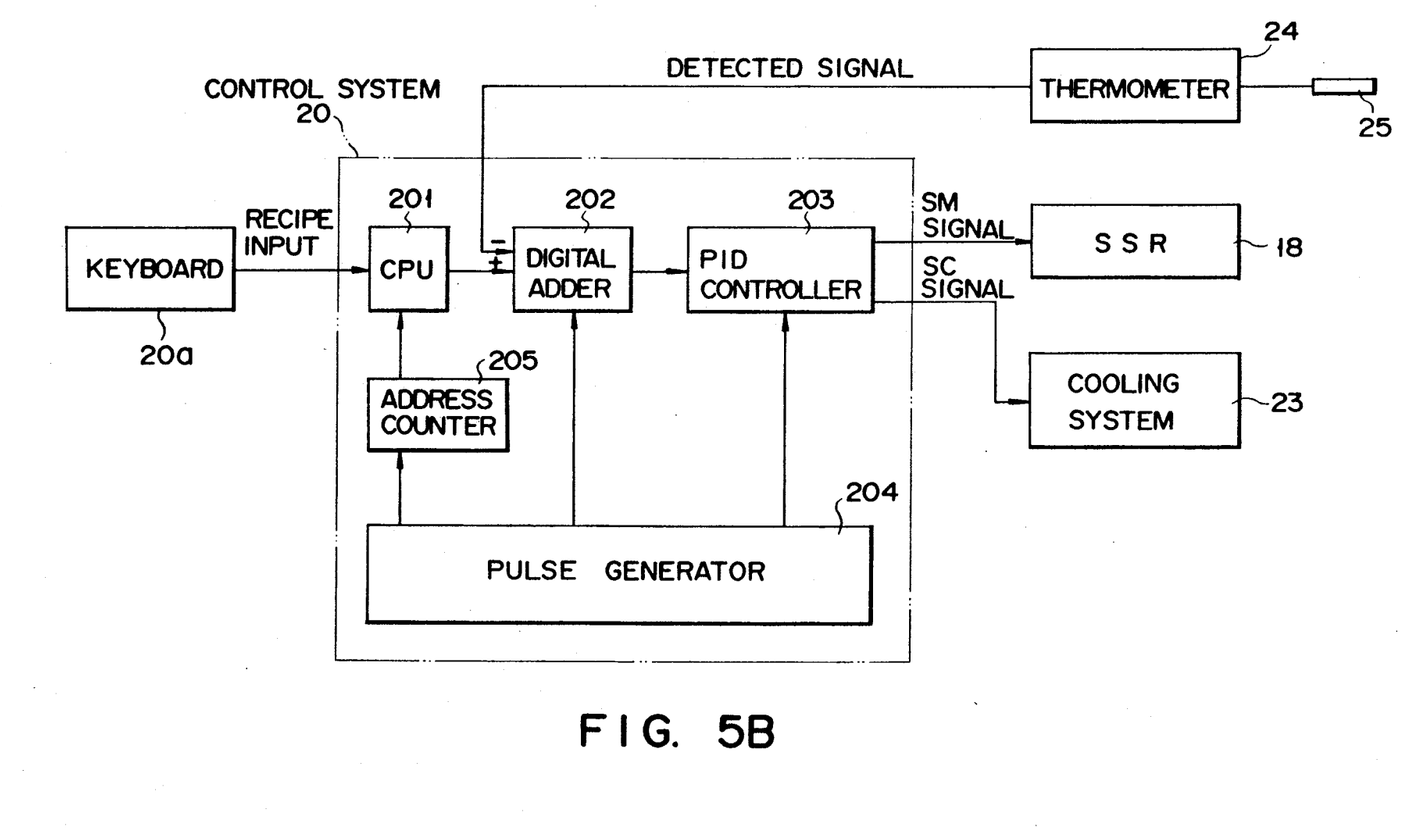
FIG. 5B is a block diagram showing a circuit of a control system which is included in an adhesion unit.

As shown in FIG. 5B, the PID controller 203 in the control system 20 is connected to the SSR 18. PWM signal SM is inputted from the PID controller 203 to the SSR 18. The PID controller 203 is also connected to a cooling system 23 to apply signal SC to the latter. A thermometer 24 which has a sensor 25 is connected to a digital adder 202 of the control system 20. The thermal sensor 25 is attached to an appropriate position on the underside of the conductive thin film 14. A keyboard 20a is connected to the input section of the CPU 201. Numeral values for creating desired adhesion processing condition (or recipe including heating and other conditions) are inputted to the CPU 201 by the keyboard 20a. Pulse signals are applied from a pulse generator 204 to each of the CPU 201, digital adder 202 and PID controller 203 at a timing of one second. A address counter 205 is arranged between the CPU 201 and the pulse generator 204.

The conductive thin film 14 is coated together with the electrodes 15, 16 and thermal sensor 25 by protection film 21, which is made of tetrafluoroethylene (Teflon ®) and serves to protect the conductive thin film 14 and the like.

A cooling jacket 22 is arranged under the stage 12 to exchange heat with the conductive thin film 14 through the protection film 21. An inner passage 22a is formed in the jacket 22, communicating with a coolant supply source in the cooling system 23, which includes a compressor and an evaporator to circulate coolant through the jacket 22. The output section of the control system 20 is connected to the input section of the cooling system 23. The control system 20 serves to apply control signal SC to the cooling system 23 responsive to the recipe and temperature detecting signal so as to control the amount of coolant supplied from the cooling system 23 to the jacket 22.

A case where the surface of the semiconductor wafer W is adhesion-processed will be described with reference to FIGS. 6A through 6C and 7.

(I) A predetermined recipe is inputted to the CPU 201 by the keyboard 20a. The recipe is a command table including temperature/time point data in which temperature raising and lowering speed is in a range of 50° to 200° C. per minute. Heating temperature is in a range of 100° to 150° C. and hold time is in a range of 0.1 to 1 minute. The CPU 201 interpolates points between any two adjacent point data of the recipe, thereby obtaining a master curve (thermal history curve).

(II) The semiconductor wafer W is carried from the sender 41 to the adhesion unit 42 by a handling device (not shown) and placed or mounted on the stage 12. The inlet of the chamber 11 through which the wafer W is carried is closed and gas in the chamber 11 is then discharged through the discharge pipe 35.

(III) PWM signal SM is applied from the PID controller 203 to the SSR 18. A predetermined amount of current is thus added from a power supply 17 of the circuit 19 to the conductive thin film 14 through the electrodes 15 and 16 to heat the conductive thin film 14. The semiconductor wafer W on the upper plate 13 is heated by the conductive thin film 14. When PWM signal SM from the PID controller 203 is changed this time, the amount of current supplied to the conductive thin film 14 is switching-controlled to raise the temperature of the wafer W at a desired heat curve.

PWM signal SM and cooling control signal SC will be described referring to FIGS. 6A through 6C.

Figure 6A:
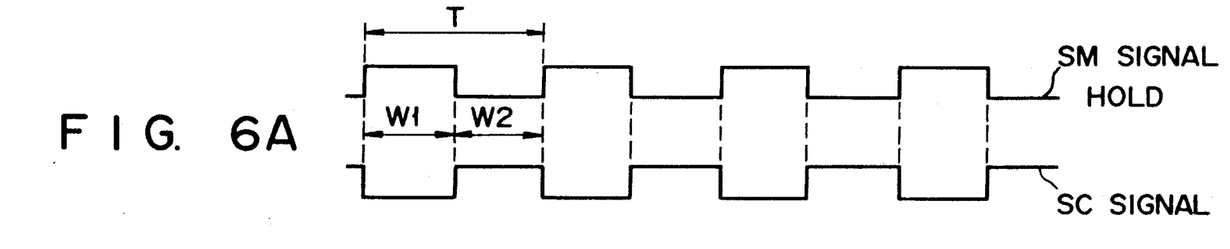
FIGS. 6A to 6C are charts intended to explain PWM (Pulse Wide Modulation) signal SM and cooling control signal SC sent from a control system to a SSR (Solid Stage Relay)
Figure 7:
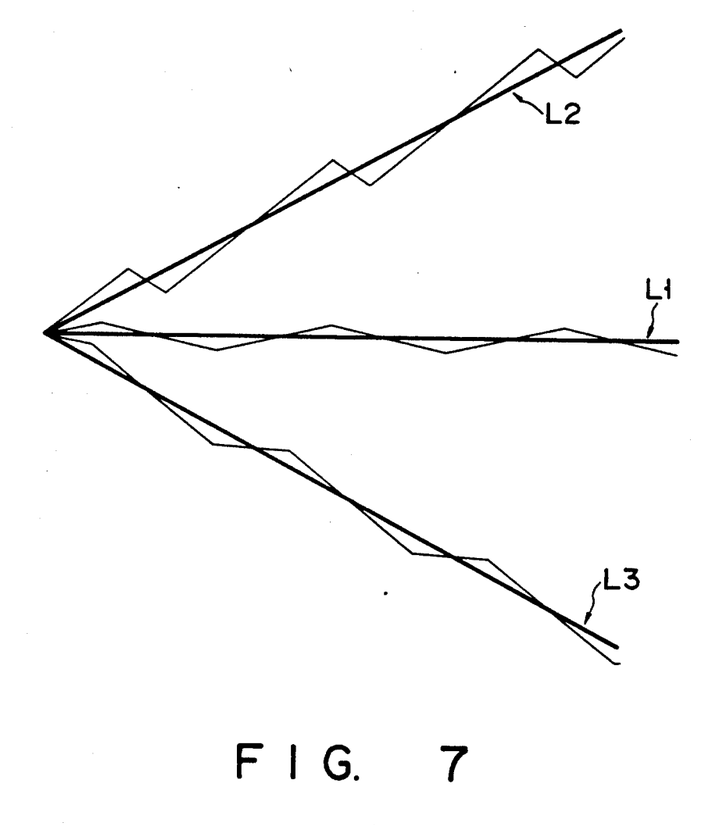
FIG. 7 is a chart intended to explain the temperature change (include ripple of temperature) of a heating plate at a time when its temperature is being raised, lowered and kept certain.

As shown in FIG. 6A, when pulse widths $W_1$ and $W_2$ of each of signals SM and SC are $\frac{1}{2}T$ (T is one cycle) or their duty cycles are 50%, as shown by a line $L_1$ in FIG. 7, the temperature of the upper plate 13 is substantially constant. The one cycle T is equal to a second, which is determined by pulse signal applied from the pulse generator 204.

Figure 6B:
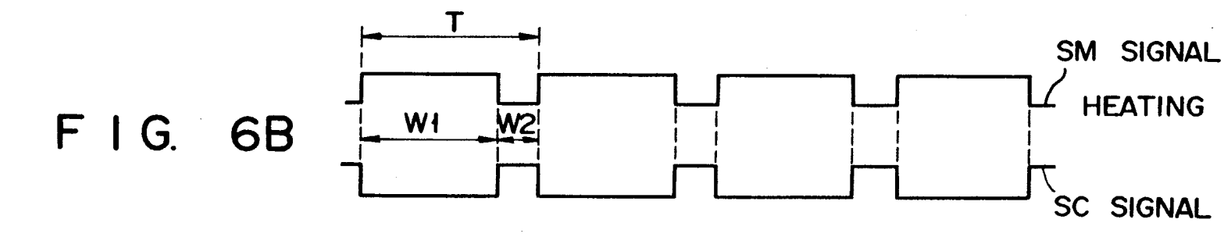

As shown in FIG. 6B, when the pulse width $W_1$ of signal SM in one cycle T is larger than $\frac{1}{2}T$ or its duty cycle exceeds 50%, as shown by a line $L_2$ in FIG. 7, the temperature of the upper plate 13 is raised.

Figure 6C:
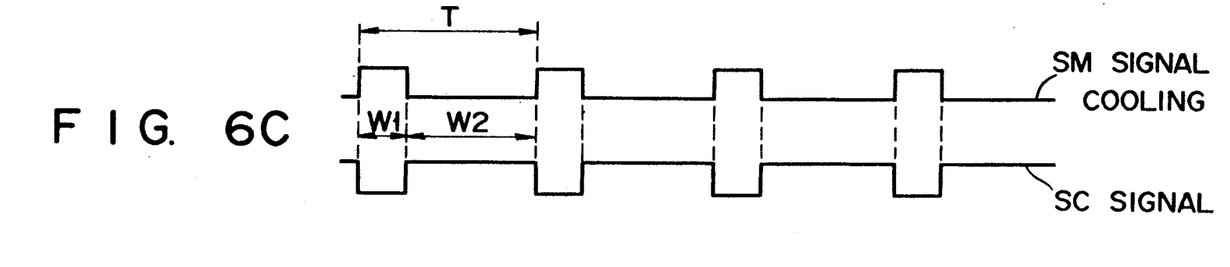

As shown in FIG. 6C, when the pulse width $W_1$ of signal SM in one cycle T is smaller than $\frac{1}{2}T$ or its duty cycle is smaller than 50%, as shown by a line $L_3$ in FIG. 7, the temperature of the upper plate 13 is lowered.

When the pulse width of signal SM in one cycle T is variously changed in this manner, the extent to which the upper plate 13 is heated by the conductive thin film 14 can be freely changed to raise the temperature of the wafer W at a desired heat curve. The other, when the pulse width of signal SC in one cycle T is variously changed in this manner, the upper plate 13 is cooled by the cooling system 23.

(IV) The temperature of the thin film 14 is detected by the sensor 25 of the thermometer 24 and this detection signal is inputted to the digital adder 202. The temperature measured is determined on the basis of the detection signal in the digital adder 202 and the amount of current supplied to the conductive thin film 14 is feedback-controlled responsive to the temperature measured. When the measured temperature which is determined on the basis of the detection signal coincides with a predetermined temperature to be held, the duty cycle of signal SM is made equal to 50% to hold the temperature of the upper plate 13 in a range of 100° to 150° C. for a time period of 0.5 to 1 minute.

(V) HMDS solution is sprayed onto the semiconductor wafer W which is held at the predetermined temperature, thereby causing HMDS to adhere to the surface of the wafer W.

(VI) After the wafer W is held at the predetermined temperature, the duty cycle of signal SM is changed smaller than 50% to lower the temperature of the upper plate 13. Signal SC whose duty cycle is larger than 50% is applied from the PID controller 203 to the cooling system 23 at the same time to supply coolant to the jacket 22 so as to forcedly cool the upper plate 13. Signals SM and SC are determined this time by the PID controller 203 responsive to the temperature of the thin film 14 detected by the sensor 25.

(VII) After the semiconductor wafer A is cooled, the pin is projected to pick up the wafer W from the upper plate 13 and carry it out of the chamber.

According to the above-described embodiment, heat curve of temperature-raising and lowering periods can be controlled, as a result of the throughput of wafers increase.

A case where the semiconductor wafer W is baking-processed after it is coated by resist will be described referring to FIGS. 8 through 10. That portion of description relating to the baking process which overlaps the above description relating to the adhesion process will be omitted.

Figure 10:
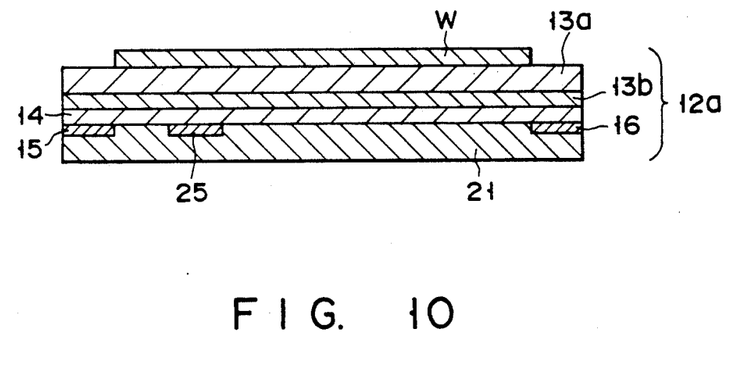
FIG. 10 shows longitudinal sectional view of another heating plate.

FIG. 10 shows a wafer-stage 12a employed by the baking unit 44. A ceramic thin film 13b is interposed between the conductive thin film 14 and an upper plate 13a in the case of this wafer-mounted table 12a. The ceramic thin film 13b is formed to flame-spraying ceramic powder onto the surface of the upper plate 13a which is made of aluminum alloy. The upper plate 13a is insulated from the conductive thin plate 14 by the ceramic thin film 13b.

Figure 8:
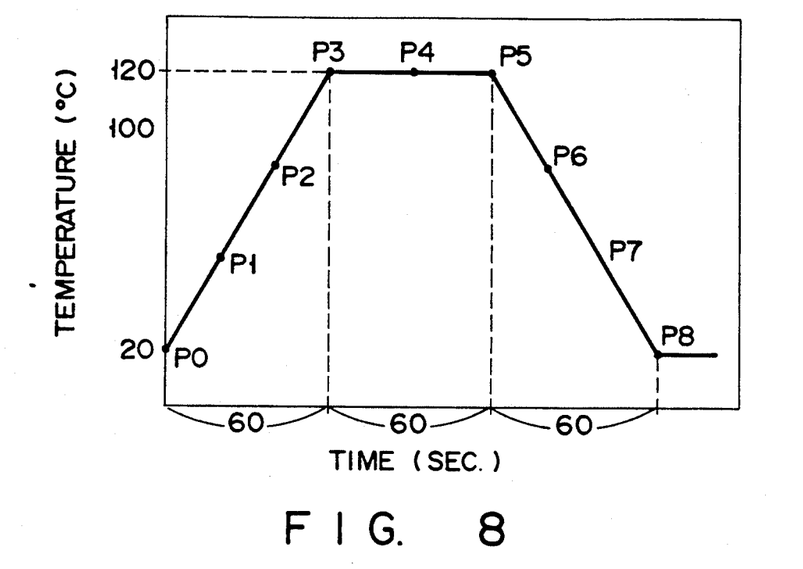
FIG. 8 is a diagram showing one of a recipe relating to a thermal history curve of a wafer-stage.

Using the baking unit 44 provided with this wafer-stage 12a, the process of baking the wafer W is carried out as follows:

(I) A recipe shown in FIG. 8 is inputted to the CPU 201 by the keyboard 20a. Points P0 to P8 are set in the recipe so as to surely reproduce thermal history curve. Information relating to temperatures and times at these points P0 to P8 is inputted as a command temperature table to the CPU 201. In the case of this recipe, heating and cooling speeds are 100° C. per minute, temperature to be held is 120° C. and the time during which the temperature is held is 60 seconds.

The CPU 201 interpolates points between any two adjacent point data of the recipe thereby a master curve.

(II) The semiconductor wafer W which has been coated by resist is carried from the coating unit 43 to the baking unit 44 and mounted on the stage 12a.

(III) PWM signal SM is applied from the PID controller 203 to the SSR 18 to energize the conductive thin film 14. The conductive thin film 14 is thus heated to heat the semiconductor wafer W on the upper plate 13a. PWM signal SM is changed this time and the amount of current supplied to the conductive thin film 14 is thus switching-controlled.

(IV) The temperature of the thin film 14 is detected by the sensor 25 of the thermometer 24 and this detection signal is inputted to the digital adder 202. Temperature measured is determined on the basis of the detection signal in the digital adder 202. The amount of current supplied to the conductive thin film 14 is feedback-controlled responsive to this temperature measured. It is arranged by this feedback control in the course of heating the wafer W that the thermal history curve of the wafer W passes through the points P1 and P2 and reaches the point P3.

(V) When the thermal hysteresis of the wafer W reaches the point P3, the duty cycle of signal SM applied from the PID controller 203 is made equal to 50% and the temperature of the wafer W is held certain for 60 minutes. The thermal history curve of the wafer W is checked at the point P4 in the course of holding the temperature certain. When the temperature of the wafer W reaches the point P5, the duty cycle of signal SM applied from the PID controller 203 is changed smaller than 50% to lower the temperature of the wafer W on the upper plate 13.

(VI) As the result, the resist which has been coated on the semiconductor wafer W becomes such a resist film as has predetermined characteristics. After this baking process, the pin is projected to pick up the semiconductor wafer W from the stage 12a and carry it from the baking unit 44 to the receiver 45.

A case where the semiconductor wafer W is baked according to another recipe will be described. Description will be omitted if it repeats the above-made one.

Figure 9:
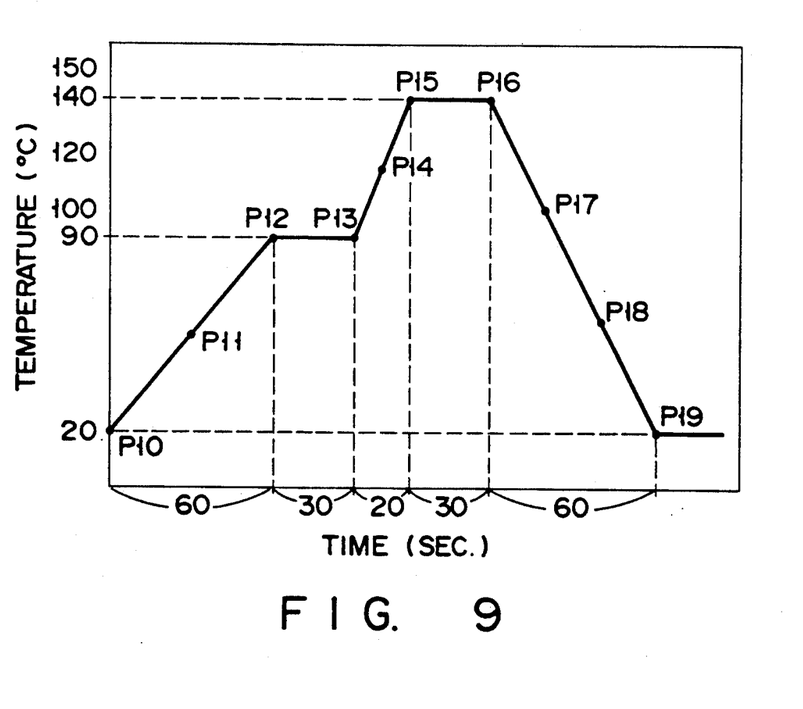
FIG. 9 is a diagram showing another of a recipe relating to a thermal history curve of a wafer-stage.

(I) A recipe shown in FIG. 9 is inputted into the PID controller 203 by the keyboard 20a. Points P10 to P19 are set in the recipe so as to surely reproduce the thermal history curve of the wafer W. Information relating to temperatures and times at these points P10 to P19 is inputted as a command temperature table to the CPU 201. In the case of this recipe, the heating speed at a first step is 70° C. per minute, the temperature to be held at a first step is 90° C., the heating speed at a second step is 150° C. per minute, the temperature to be held at a second step is 140° C. and the cooling speed is 2° C. The time during which the temperature is held at the first and second steps, respectively, is 30 seconds.

(II) After being coated by resist, the semiconductor wafer W is placed on the stage 12a in the baking unit 44.

(III) PWM signal SM is applied from the PID controller 203 to the SSR 18 to energize the conductive thin film 14 and heat the semiconductor wafer W. When PWM signal SM is changed this time, the amount of current supplied to the conductive thin film 14 is switching-controlled.

(IV) The temperature of the thin film 14 is detected by the sensor 25 and the amount of current supplied to the conductive thin film 14 is feedback-controlled on the basis of signal obtained at this time of detection. It is arranged by this feedback control in the course of heating the wafer W that the heat condition of the wafer W passes through the point P11 and reaches the point P12.

(V) When the condition of the wafer W reaches the point P12, the duty cycle of signal SM applied from the PID controller 203 is made equal to 50% to hold the temperature of the wafer W certain for 30 seconds. When it reaches the point P13, the duty cycle of signal SM applied from the PID controller 203 is changed larger than 50% to raise the temperature of the wafer W on the upper plate 13a. When the semiconductor wafer W is step-heated in this manner, the resist which has been coated on the surface of the wafer W becomes a resist film excellent in thermal stability.

The wafer-stage 12a of the composite type employed by the above-described embodiments is suitable for use with large-sized baking units. This is because the capacity of the sintering furnace makes it difficult for the large-sized upper plate 13a to be made of ceramic without any fault.

The surface area of end faces of the heating plate can be made smaller in the case of the above-mentioned heating means. The loss of heat energy can be thus reduced smaller than 5%. This makes it possible to neglect heat loss at the wafer-heating time, which is called end effect. The temperature distribution on the surface of the upper plate 13a can be made uniform accordingly. Namely, the temperature on the surface of the upper plate 13a can be kept in a range of 100° C.±0.5° C. in the case where the semiconductor wafer W on the upper plate 13a is to be heated to 100° C. The thickness of the upper plate made of aluminum must be made larger than 50 mm in order to achieve this temperature control by the conventional means. When the upper plate has such thickness, its heat capacity becomes larger and its response to heating and cooling becomes slower.

Although description has been made on the resist processing system in the case of the above-mentioned embodiments, the present invention can also be applied to the system for batch-processing a plurality of the semiconductor wafers W in a wafer boat.

Figure 11:
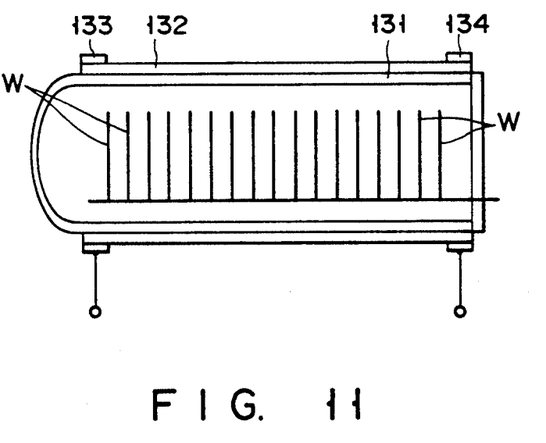
FIG. 11 shows longitudinal sectional view of a heat-processing system of a batch type.
Figure 12:
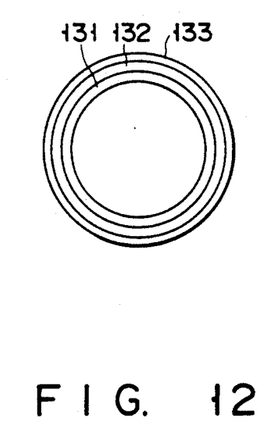
FIG. 12 shows transversal sectional view of a heat-processing system of a batch type.

As shown in FIGS. 11 and 12 a reaction tube 131 is arranged on the outer or inner wall face of a cylindrical conductive thin film 132, and electrodes 133 and 134 each shaped like a belt are located at appropriate positions on the thin film 132. When current is supplied to these paired electrodes 133 and 134, a plurality of semiconductor wafers W in a wafer boat 135 can be heated at the same time.

Needless to say, the wafers W can be heated according to the high-frequency induction or dielectric heating manner even in the case of the batch-processing system.

Further, the heating means is not limited to the above-mentioned conductive thin film but any of those which are small in heat capacity and excellent in temperature control can be employed.

Still further, the present invention has been applied to the adhesion and baking processes for semiconductor wafers in the above-described embodiments, but it can also be applied to any of the ion implantation, CVD, etching and ashing processes.

Still further, the case where the semiconductor wafers are heated and cooled has been described in the above-mentioned embodiments, but the present invention can be instead applied to other semiconductor devices such as LCD.

According to the present invention, the thermal history curve of the semiconductor wafer can be positively controlled at the wafer-heating and -cooling time as well as at the time when the temperature of the wafer is held certain. When semiconductor devices of high integration and high density are to be resist-processed, therefore, the characteristics of photoresist can be accurately controlled according to their fine patterns.

Further, when the semiconductor devices of same kind are to be heated and cooled, their thermal history curve can be controlled accurately same at their heating and cooling times, thereby enhancing their reliability. Particularly, their thermal history curve can be made accurately same. Therefore, no irregularity can be found in the property of their resists, and their qualities can be made same.

Still further, the cooling unit can be omitted and the whole of the resist-processing unit can be thus made smaller in size.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A method of heat-processing an object, comprising the steps of;
    disposing an object on a stage having heating means and cooling means;
    storing in a storing means, recipe information including temperature-time points in a heating step for heating said object from ambient temperature to a process temperature, a cooling step for cooling the object from said process temperature to ambient temperature, and a processing step during which the process temperature is maintained;
    cooling the object with said cooling means, while heating the object with a conductive thin film of said heating means;
    detecting the temperature of the object directly or indirectly;
    reading the information of the recipe from the storing means;
    controlling at least one of an increase and decrease of the object temperature in accordance with the detected temperature and the recipe information.

2. The method according to claim 1, wherein said heating means is capable of excessively heating the object relative to a heat capacity of the object, and said cooling means is capable of excessively cooling the object relative to the heat capacity of the object.

3. The method according to claim 1, wherein said cooling means includes a cooling system for removing heat from a region which includes the object.

4. A method according to claim 1, wherein:
the step of controlling is accomplished by controlling said heating and cooling means in accordance with the detected temperature and the recipe information.

5. A method according to claim 1, wherein:
said cooling means comprises convective cooling means.

6. A method according to claim 5, wherein:
said convective cooling means comprises a cooling fluid enclosed in a tube in the vicinity of the object.

7. An apparatus for heat-processing an object, comprising:
a stage including heating means and cooling means, said heating means comprising a conductive thin film for heating the object;
detecting means for detecting temperatures of the object on the stage;
storing means for storing recipe information, said recipe information comprising temperature-time points in a heating step for heating said object from ambient temperature to a process temperature, a cooling step for cooling the object from said process temperature to ambient temperature, and a processing step during which the process temperature is maintained; and
process control means for controlling the heating and cooling means in accordance with the time-temperature recipe information and temperature of the object.

8. The apparatus according to claim 7, wherein said heating means has an excessive heating capability relative to a heat capacity of the object, and said cooling means has an excessive cooling capability relative to the heat capacity of the object.

9. The apparatus according to claim 7, wherein a ceramic coating is applied to said conductive thin film.

10. The apparatus according to claim 7, further comprising:
means for convectively cooling a region near the object on the stage.

11. An apparatus according to claim 7, wherein said cooling means includes a cooling system for removing heat from a region in which the object is located.

12. An apparatus according to claim 11, wherein said cooling means includes a refrigerant circulated through said region in which the object is located.

* * * * *